United States Patent
Chillarige et al.

(10) Patent No.: US 9,864,004 B1
(45) Date of Patent: Jan. 9, 2018

(54) SYSTEM AND METHOD FOR DIAGNOSING FAILURE LOCATIONS IN ELECTRONIC CIRCUITS

(71) Applicant: Cadence Design Systems, Inc., San Jose, CA (US)

(72) Inventors: Sameer Chakravarthy Chillarige, Uttar Pradesh (IN); Brion L. Keller, Binghamton, NY (US); Joseph Michael Swenton, Owego, NY (US); Sharjinder Singh, Delhi (IN); Anil Malik, Delhi (IN)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 15/073,001

(22) Filed: Mar. 17, 2016

(51) Int. Cl.
*G06F 11/22* (2006.01)
*G06F 17/50* (2006.01)
*G01R 31/317* (2006.01)
*G01R 31/3177* (2006.01)

(52) U.S. Cl.
CPC ... *G01R 31/31703* (2013.01); *G01R 31/3177* (2013.01)

(58) Field of Classification Search
USPC .......................... 716/136; 714/728, 732, 742
See application file for complete search history.

(56) References Cited

U.S. PATENT DOCUMENTS

| | | | | |
|---|---|---|---|---|
| 2004/0246337 A1* | 12/2004 | Hasegawa | ...... | G01R 31/318536 348/189 |
| 2006/0041814 A1* | 2/2006 | Rajski | ............ | G01R 31/318547 714/742 |
| 2007/0038911 A1* | 2/2007 | Koenemann | ..... | G01R 31/31703 714/732 |
| 2007/0234157 A1* | 10/2007 | Rajski | ............ | G01B 31/318547 714/728 |

* cited by examiner

*Primary Examiner* — Brian Ngo
(74) *Attorney, Agent, or Firm* — Mark H. Whittenberger, Esq.; Holland & Knight LLP

(57) ABSTRACT

Embodiments for diagnosing failure locations in one or more electronic circuits. Embodiments may include generating a plurality of core instances of at least one core, for each electronic circuit, with one or more outputs and compressing the outputs of each instance into primary output pins based upon compression equations. Embodiments may include applying test patterns to the plurality of core instances and identifying failures based upon compressed test patterns received at the primary output pins. Embodiments may include performing fault selection on a single core instance for each failure associated with the plurality of core instances and performing fault simulations on the single core instance for each candidate faults associated with the plurality of core instances. Embodiments may include generating fault signatures for each detected fault based upon the instances associated with each detected fault and analyzing each fault signature to determine failure locations.

20 Claims, 12 Drawing Sheets

SYSTEM AND METHOD FOR DIAGNOSING FAILURE LOCATIONS IN ELECTRONIC CIRCUITS

FIELD OF THE INVENTION

The present disclosure relates to diagnosing failure locations in an electronic circuit design.

DISCUSSION OF THE RELATED ART

Automated Test Equipment (ATE) utilizes software tools that may be used in the design and analysis of numerous electronic systems such as printed circuit boards (PCBs) and integrated circuits (ICs). During production, defects may be introduced into these electronic circuits which can cause circuit failures. A complex IC may contain millions of possible failure locations and diagnosing a failure location may require considerable time and simulation resources. Additionally, diagnosing a failing IC in a hierarchical test methodology that has multiple active cores may require compressing an output signature which can make identifying the failing core instance and location of the failure within each core instance considerably more difficult. It may be of interest to seek a failure location diagnostic process to diagnose failing ICs containing multiple active core instances.

SUMMARY OF INVENTION

In an embodiment of the present disclosure, a method for diagnosing failure locations in one or more electronic circuits is provided. The method may include generating, using at least one processor, a plurality of core instances of at least one core, for each electronic circuit of the one or more electronic circuits, with one or more outputs and compressing the one or more outputs of each of the plurality of core instances into one or more primary output pins based upon, at least in part, one or more compression equations. Embodiments may further include applying one or more test patterns to the plurality of core instances and identifying one or more failures based upon, at least in part, one or more compressed test patterns received at the one or more primary output pins. Embodiments may also include performing fault selection on a single core instance for each of the one or more failures associated with the plurality of core instances and performing fault simulations on the single core instance for each of one or more candidate faults associated with the plurality of core instances. Embodiments may further include generating one or more fault signatures for each of one or more detected faults based upon, at least in part, the plurality of core instances associated with each of the one or more detected faults and analyzing each of the one or more fault signatures to determine one or more failure locations for each of the one or more failures.

One or more of the following features may be included. In some embodiments, the plurality of core instances may be instances of a single out-of-context core. In some embodiments, the single core instance may be an out-of-context core. The method may further include determining the one or more compressor equations for each of the plurality of core instances. In some embodiments, performing fault selection on the single core instance may also include identifying the primary output pin associated with each of the one or more failures, tracing back from the primary output pin associated with each of the one or more failures to one or more output pins associated with each of the plurality of core instances. Performing fault selection may further include tracing back from each of the one or more output pins associated with the single core instance to obtain the one or more candidate faults associated with each of the one or more output pins and maintaining a record of the plurality of core instances associated with each of the one or more candidate faults. In some embodiments, performing fault simulations on the single core instance may further include applying one or more test patterns to one of the plurality of core instances and identifying the one or more detected faults based upon, at least in part, one or more compressed test patterns received at the one or more outputs of the single core instance.

In some embodiments, generating the one or more fault signatures may also include generating a list of one or more internal detect locations for each of the one or more detected faults, and applying the compressor equations to the internal detect locations to generate the one or more fault signatures for each detected fault and each of the plurality of core instances associated with that detected fault. In some embodiments, analyzing each of the one or more fault signatures may further include comparing the one or more failures to the one or more fault signatures, performing multiple defect analysis on each of the plurality of core instances based upon, at least in part, the one or more fault signatures. Analyzing each of the one or more failures may further include scoring the one or more fault signatures based upon, at least in part, the multiple defect analysis of each of the plurality of core instances and reporting the results of the scoring.

In another embodiment of the present disclosure a system for diagnosing failure locations in one or more electronic circuits is provided. The system may include a computing device having at least one processor configured to generate a plurality of core instances of at least one core, for each electronic circuit of the one or more electronic circuits, with one or more outputs and compress the one or more outputs of each of the plurality of core instances into one or more primary output pins based upon, at least in part, one or more compression equations. The at least one processor may be further configured to apply one or more test patterns to the plurality of core instances and identify one or more failures based upon, at least in part, one or more compressed test patterns received at the one or more primary output pins. The at least one processor may also be configured to perform fault selection on the single core instance for each of the one or more failures associated with the plurality of core instances.

The at least one processor may be further configured to perform fault simulations on the single core instance for each of one or more candidate faults associated with the plurality of core instances. The at least one processor may also be configured to generate one or more fault signatures for each of one or more detected faults based upon, at least in part, the plurality of core instances associated with each of the one or more detected faults and analyze each of the one or more fault signatures to determine one or more failure locations for each of the one or more failures.

One or more of the following features may be included. In some embodiments, the plurality of core instances may be instances of a single out-of-context core. In some embodiments, the single core instance may be an out-of-context core. The at least one processor may be further configured to determine the one or more compressor equations for each core instance of the plurality of core instances. In some embodiments, performing fault selection of the single core instance may include identifying the primary output pin associated with each of the one or more failures and tracing back from the primary output pin associated with each of the one or more failures to one or more output pins associated with each of the plurality of core instances. Performing fault selection may also include tracing back from each of the one or more output pins associated with the single core instance to obtain the one or more candidate faults associated with each of the one or more output pins and maintaining a record of the plurality of core instances associated with each of the one or more candidate faults. In some embodiments, performing fault simulations on the single core instance may also include applying one or more test patterns to the single core instance and identifying the one or more detected faults based upon, at least in part, one or more compressed test patterns received at the one or more outputs of the single core instance.

In some embodiments, wherein generating the one or more fault signatures may also include generating a list of one or more internal detect locations for each of the one or more detected faults and applying the compressor equations to the internal detect locations to generate the one or more fault signatures for each detected fault and each of the plurality of core instances associated with that detected fault. In some embodiments, analyzing each of the one or more fault signatures may also include comparing the one or more failures to the detected faults and performing multiple defect analysis on each of the plurality of core instances based upon, at least in part, the one or more fault signatures. Analyzing each of the one or more failures may further include scoring the one or more fault signatures based upon, at least in part, the multiple defect analysis of each of the plurality of core instances and reporting the results of the scoring.

Additional features and advantages of embodiments of the present disclosure may be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the present disclosure as claimed.

BRIEF DESCRIPTION OF THE DRAWINGS

The accompanying drawings, which are included to provide a further understanding of embodiments of the invention and are incorporated in and constitute a part of this specification, illustrate embodiments of the invention and together with the description serve to explain the principles of embodiments of the invention.

DETAILED DESCRIPTION OF THE EMBODIMENTS

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

The present disclosure generally relates to systems and methods for diagnosing failure locations in one or more electronic circuits. More specifically, systems and methods that may diagnose failing locations in multiple failing core instances is provided.

Figure 1:
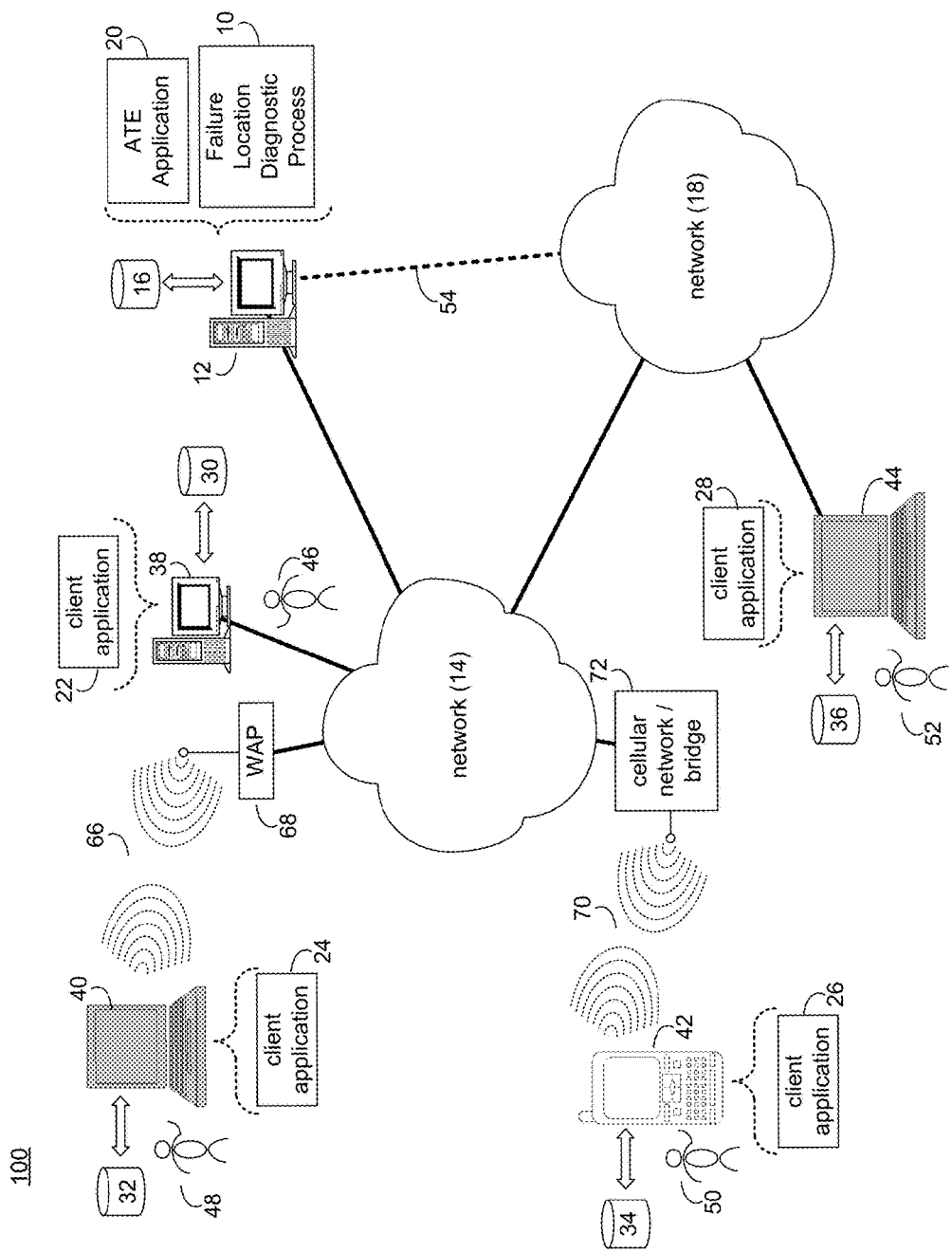
FIG. 1 is a diagram depicting an embodiment incorporating failure location diagnostic process in accordance with the present disclosure.

Referring to FIG. 1, there is shown failure location diagnostic process 10 that may reside on and may be executed by server computer 12, which may be connected to network 14 (e.g., the Internet or a local area network). Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft® Windows® Server; Novell® NetWare®; or Red Hat® Linux®, for example. (Microsoft and Windows are registered trademarks of Microsoft Corporation in the United States, other countries or both; Novell and NetWare are registered trademarks of Novell Corporation in the United States, other countries or both; Red Hat is a registered trademark of Red Hat Corporation in the United States, other countries or both; and Linux is a registered trademark of Linus Torvalds in the United States, other countries or both.) Additionally/alternatively, the failure location diagnostic process may reside on and be executed, in whole or in part, by a client electronic device, such as a personal computer, notebook computer, personal digital assistant, or the like.

The instruction sets and subroutines of failure location diagnostic process 10, which may include one or more software modules, and which may be stored on storage device 16 coupled to server computer 12, may be executed by one or more processors (not shown) and one or more memory modules (not shown) incorporated into server computer 12. Storage device 16 may include but is not limited to: a hard disk drive; a solid state drive, a tape drive; an optical drive; a RAID array; a random access memory (RAM); and a read-only memory (ROM). Storage device 16 may include various types of files and file types including but not limited, to hardware description language (HDL) files, which may contain the port type descriptions and executable specifications of hardware blocks.

Server computer 12 may execute a web server application, examples of which may include but are not limited to: Microsoft IIS, Novell Webserver™, or Apache® Webserver, that allows for HTTP (i.e., HyperText Transfer Protocol) access to server computer 12 via network 14 (Webserver is a trademark of Novell Corporation in the United States, other countries, or both; and Apache is a registered trademark of Apache Software Foundation in the United States, other countries, or both). Network 14 may be connected to one or more secondary networks (e.g., network 18), examples of which may include but are not limited to: a local area network; a wide area network; or an intranet, for example.

Server computer 12 may execute an automatic test equipment (ATE) application (e.g., ATE application 20), examples of which may include, but are not limited to those available from the Assignee of the present application. ATE application 20 may interact with one or more ATE client applications (e.g., ATE client applications 22, 24, 26, 28). ATE application 20 may be referred to herein as a design tool.

Failure location diagnostic process 10 may be a standalone application, or may be an applet/application/script that may interact with and/or be executed within ATE application 20. In addition/as an alternative to being a server-side process, the failure location diagnostic process may be a client-side process (not shown) that may reside on a client electronic device (described below) and may interact with an ATE client application (e.g., one or more of ATE client applications 22, 24, 26, 28). Further, the failure location diagnostic process may be a hybrid server-side/client-side process that may interact with ATE application 20 and an ATE client application (e.g., one or more of client applications 22, 24, 26, 28). As such, the failure location diagnostic process may reside, in whole, or in part, on server computer 12 and/or one or more client electronic devices.

The instruction sets and subroutines of ATE application 20, which may be stored on storage device 16 coupled to server computer 12 may be executed by one or more processors (not shown) and one or more memory modules (not shown) incorporated into server computer 12.

The instruction sets and subroutines of ATE client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory modules (not shown) incorporated into client electronic devices 38, 40, 42, 44 (respectively). Storage devices 30, 32, 34, 36 may include but are not limited to: hard disk drives; solid state drives, tape drives; optical drives; RAID arrays; random access memories (RAM); read-only memories (ROM), compact flash (CF) storage devices, secure digital (SD) storage devices, and a memory stick storage devices. Examples of client electronic devices 38, 40, 42, 44 may include, but are not limited to, personal computer 38, laptop computer 40, mobile computing device 42 (such as a smart phone, netbook, or the like), notebook computer 44, for example. Using client applications 22, 24, 26, 28, users 46, 48, 50, 52 may access ATE application 20 and may allow users to e.g., utilize failure location diagnostic process 10.

Users 46, 48, 50, 52 may access ATE application 20 directly through the device on which the client application (e.g., client applications 22, 24, 26, 28) is executed, namely client electronic devices 38, 40, 42, 44, for example. Users 46, 48, 50, 52 may access ATE application 20 directly through network 14 or through secondary network 18. Further, server computer 12 (i.e., the computer that executes ATE application 20) may be connected to network 14 through secondary network 18, as illustrated with phantom link line 54.

The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 66 established between laptop computer 40 and wireless access point (i.e., WAP) 68, which is shown directly coupled to network 14. WAP 68 may be, for example, an IEEE 802.11a, 802.11b, 802.11g, Wi-Fi, and/or Bluetooth device that is capable of establishing wireless communication channel 66 between laptop computer 40 and WAP 68. Mobile computing device 42 is shown wirelessly coupled to network 14 via wireless communication channel 70 established between mobile computing device 42 and cellular network/bridge 72, which is shown directly coupled to network 14.

As is known in the art, all of the IEEE 802.11x specifications may use Ethernet protocol and carrier sense multiple access with collision avoidance (i.e., CSMA/CA) for path sharing. The various 802.11x specifications may use phase-shift keying (i.e., PSK) modulation or complementary code keying (i.e., CCK) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows, Microsoft Windows CE®, Red Hat Linux, or other suitable operating system. (Windows CE is a registered trademark of Microsoft Corporation in the United States, other countries, or both).

Figure 2:
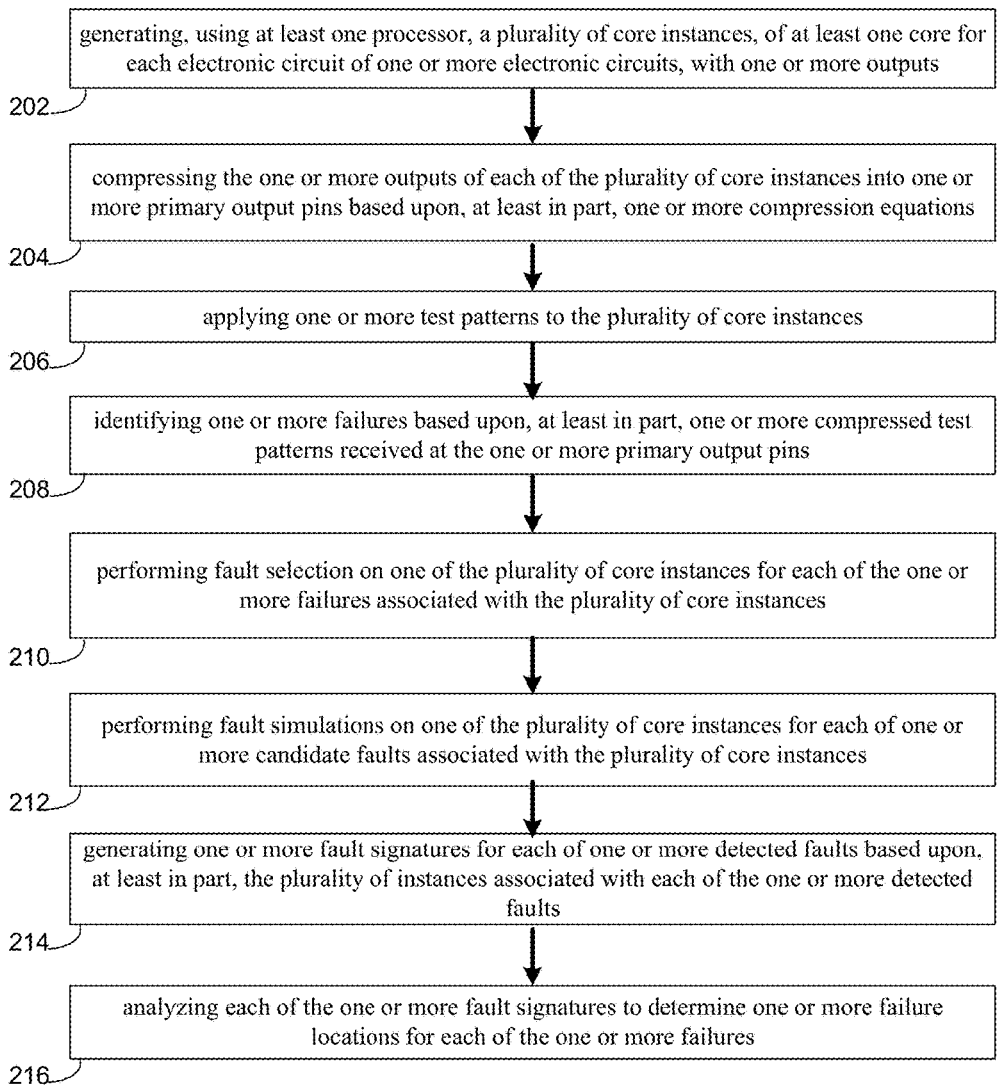
FIG. 2 is a flowchart depicting operations consistent with an embodiment incorporating failure location diagnostic process in accordance with the present disclosure.

Referring now to FIGS. 2-12, embodiments consistent with the failure location diagnostic process 10 are provided. FIG. 2 includes a flowchart 200 depicting a failure location diagnostic process consistent with embodiments of the present disclosure. As will be discussed in further detail herein below, the failure location diagnostic process described herein may include generating (202), using at least one processor, a plurality of core instances of at least one core, for each electronic circuit of the one or more electronic circuits, with one or more outputs and compressing (204) the one or more outputs of each of the plurality of core instances of the at least one core into one or more primary output pins based upon, at least in part, one or more compression equations. Embodiments may further include applying (206) one or more test patterns to the plurality of core instances and identifying (208) one or more failures based upon, at least in part, one or more compressed test patterns received at the one or more primary output pins. Embodiments may also include performing (210) fault selection on a single core instance for each of the one or more failures associated with the plurality of core instances and performing (212) fault simulations on the single core instance for each of one or more candidate faults associated with the plurality of core instances. Embodiments may further include generating (214) one or more fault signatures for each of one or more detected faults based upon, at least in part, the plurality of core instances associated with each of the one or more detected faults and analyzing (216) each of the one or more fault signatures to determine one or more failure locations for each of the one or more failures. Numerous other operations are also within the scope of the present disclosure.

Figure 3:
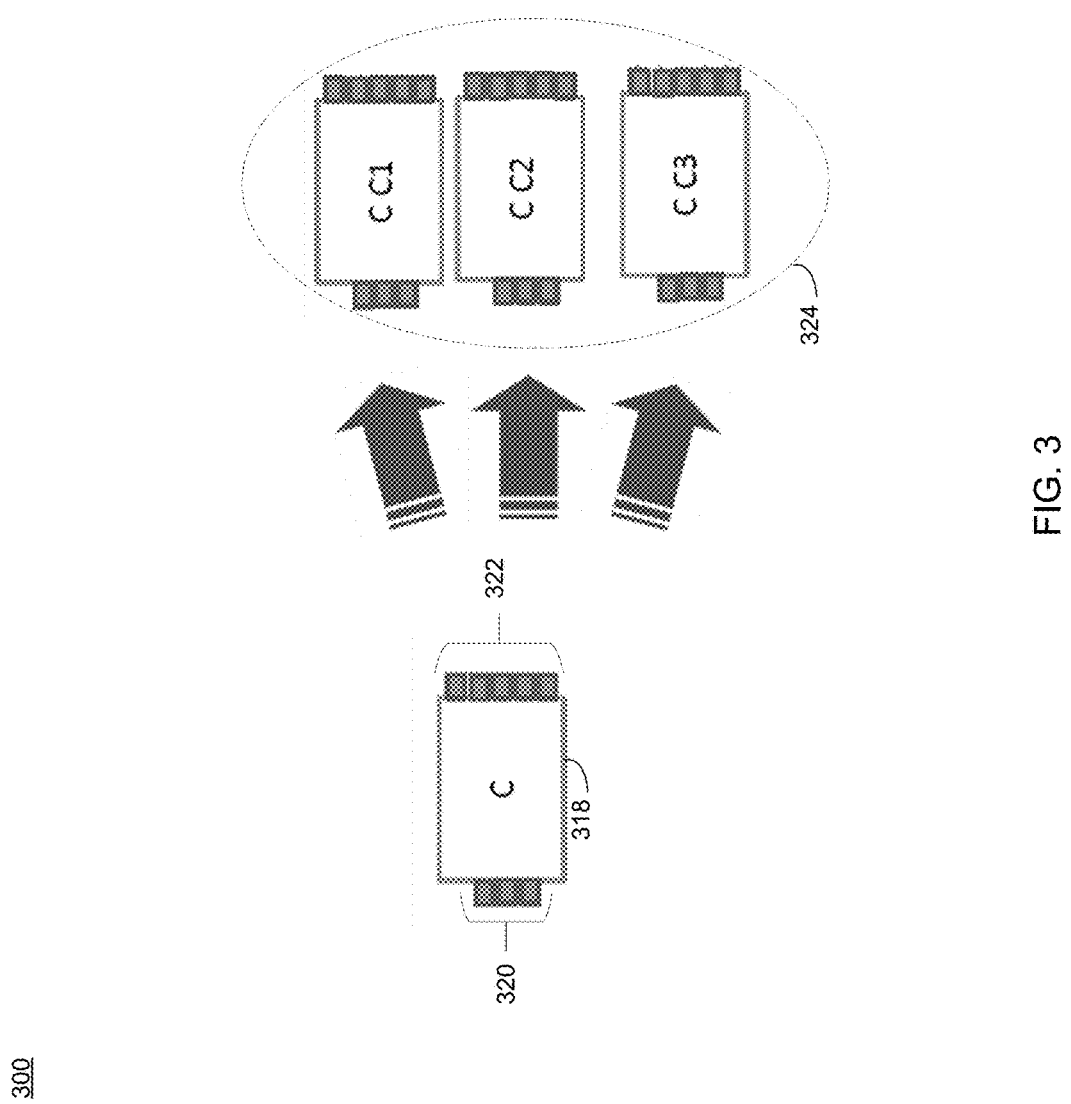
FIG. 3 is a diagram depicting an embodiment incorporating failure location diagnostic process in accordance with the present disclosure.

In some embodiments and as shown in FIG. 3, failure location diagnostic process may include generating (202), using at least one processor, a plurality of core instances of at least one core, for each electronic circuit of the one or more electronic circuits, with one or more outputs. In some embodiments, an electronic circuit or a chip may include at least one core. As will be explained in greater detail below, failure location diagnostic process 10 may be used on multiple electronic circuits and/or multiple chips to diagnose failure locations. As such, while reference may be made to "an electronic circuit" and/or "a chip", multiple electronic circuits and/or multiple chips may be diagnosed with one or more applications of failure location diagnostic process 10. A "core" 318 as used herein may include, but is not limited to, an embedded core and/or a reusable design unit, meant to be integrated as part of a larger design, that may be delivered as a soft core (HDL and RTL), firm core (gate-level netlist), or hard core (layout description). The core may be further grouped as mergeable (e.g., the core may be mixed and merged or flattened with other logic), and non-mergeable (e.g., the core may be delivered and integrated as a complete unit and "tested-in-isolation"). A core may include one or more inputs (e.g., input pins) 320 and one or more outputs (e.g., output pins) 322.

An example of a core 318 may be an intellectual property core or an "IP core". In some embodiments, an IP core may be instantiated in a way that allows it to be completely isolated from the surrounding logic. A core 318 and/or an IP core that is isolated from any surrounding logic or circuitry may be an "out-of-context core" or an "OOC core". In some embodiments, cores that may not be tested as part of the logic (hard cores provided with test patterns, for instance) may be isolated from the rest of the logic of an electronic circuit for testing. In some embodiments, isolating the core may prevent corruption of both logic and core tests and may permit application of the test patterns, as will be discussed in greater detail below.

In some embodiments, a plurality of core instances 324 of the at least one core may be generated. An "instance" and/or "core instance" as used herein may include, but is not limited to, a copy of a core. In some embodiments, the plurality of core instances may be instances of an out-of-context core. Each of the plurality of core instances 324 may be an instance of a single OOC core 318. As will be discussed in greater detail below, each of the plurality of core instances 324 or the plurality of core instances 324 may have one or more failures or defects at one or more locations that may be diagnosed with failure location diagnosis process 10.

In some embodiments, failure location diagnostic process 10 may be implemented using a hierarchical test design. A hierarchical test design as used herein, may include, but is not limited to, testing a component from which several instances of the component may be copied. In other words, only a single copy of the component or core is loaded in memory for simulations as opposed to simulating each component of a full chip design.

In one example shown in FIG. 3, a full chip design (e.g., 'DES') may include three active core instances 324 'C1', 'C2' and 'C3'. While three instances have been generated in this example, any number of instances of the at least one core are within the scope of the present disclosure. In some embodiments, the plurality of core instances 324 may be instantiated from the same identical OOC core 'C' 318. The plurality of core instances 324 may contain a skin model of the core 'C'. A "skin model" as used herein may include, but is not limited to, a limited hardware description of a core. In other words, a skin model may not contain the full hardware description of the core 'C' 318.

Figure 4:
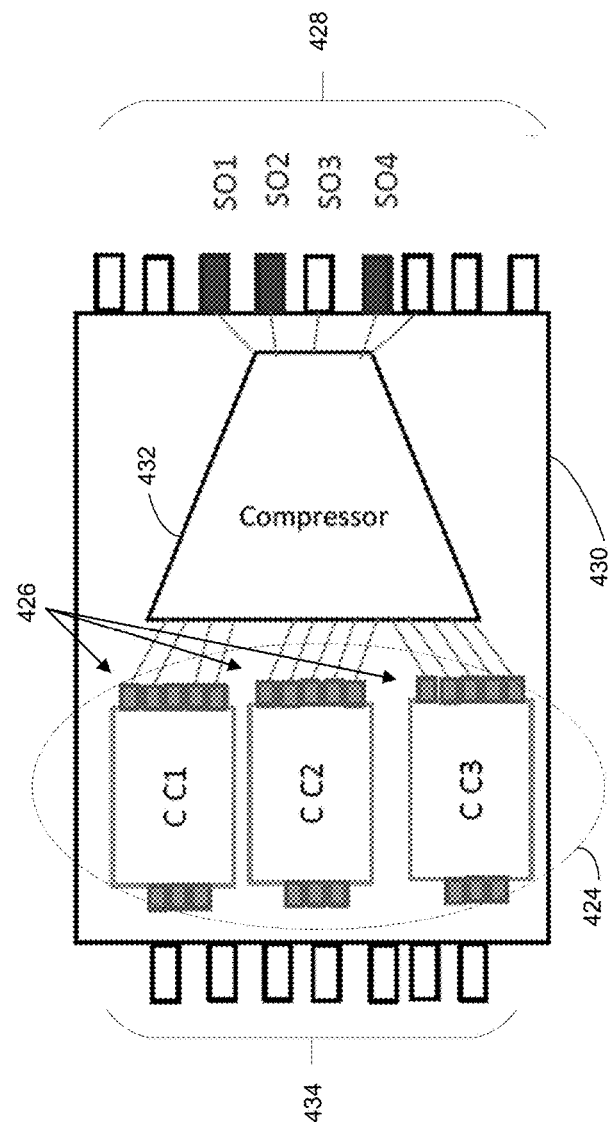
FIG. 4 is a diagram depicting an embodiment incorporating failure location diagnostic process in accordance with the present disclosure.

In some embodiments and as shown in FIG. 4, failure location diagnostic process 10 may include compressing (204) the one or more outputs 426 of each of the plurality of core instances 424 into one or more primary output pins 428 based upon, at least in part, one or more compression equations. In some embodiments, the plurality of core instances 424 may be operatively coupled with a compressor network 432. The combination of the plurality of core instances 424 and the compressor network 432 may define a chip 430. In some embodiments the chip 430 may define a "tester". A "tester" 430 as used herein may include, but is not limited to, a combination of the plurality of core instances 424 and the compression network 432. A tester 430 may be automatic test equipment (ATE), or at least a portion of ATE, that may be used to test a final electronic circuit design and/or it may be used in conjunction with other support equipment such as wafer probers to conduct tests on raw die. "Raw die" as used herein may include, but is not limited to, a portion of exposed silicon (e.g., a partially encapsulated portion of silicon) of an electronic circuit.

In some embodiments, the compressor network 432 may be operatively coupled with the primary output pins 428. The primary output pins 428 may define the output of the chip 430. Primary input pins 434 may define the input of the chip 430. The compressor network 430 may compress the one or more outputs 426 from each of the plurality of core instances 424. In some embodiments, the compressor network 430 may be designed such that the fault effects from different core instances are not canceled out. In some embodiments, the compressor network 432 may contain combinatorial gates (e.g., XOR) and sequential elements such as signature generators. In one example, the one or more outputs 426 of the plurality of core instances 424 may be "XORed" through the compressor network 430. "XORed" as used herein may include, but is not limited to, compressing the one or more outputs of the plurality of core instances 424 through combinational compression logic designed to reduce logic area overhead through XOR trees.

In some embodiments, failure location diagnostic process 10 may include determining one or more compressor equations for each core instance of the plurality of core instances. In some embodiments, one or more compressor equations may describe how each of the one or more outputs 426 of each instance of the plurality of core instances 424 is connected to the primary output pins 428. Compressor equations may be determined by analyzing the hardware in the compressor network 432. Examples of one or more compressor equations are provided below in Equations 1-15, where 'C1' represents the corresponding core instance of the plurality of core instances, 'O1' represents the output of the respective core instance, and 'SO1' represents the primary output pin(s) associated with a given core instance and the respective output of that core instance:

$$(C1,O1) \Rightarrow (SO1,SO2) \qquad (1)$$

$$(C1,O2) \Rightarrow (SO1,SO2,SO3) \qquad (2)$$

$$(C1,O3) \Rightarrow (SO1,SO4) \qquad (3)$$

$$(C1,O4) \Rightarrow (SO3,SO2) \qquad (4)$$

$$(C1,O5) \Rightarrow (SO1,SO3) \qquad (5)$$

$$(C2,O1) \Rightarrow (SO1,SO3,SO4) \qquad (6)$$

$$(C2,O2) \Rightarrow (SO1,SO2,SO3) \qquad (7)$$

$$(C2,O3) \Rightarrow (SO1,SO4) \qquad (8)$$

$$(C2,O4) \Rightarrow (SO1,SO2) \qquad (9)$$

$$(C2,O5) \Rightarrow (SO1,SO4) \qquad (10)$$

$$(C3,O1) \Rightarrow (SO4,SO2) \qquad (11)$$

$$(C3,O2) \Rightarrow (SO2,SO3) \qquad (12)$$

$$(C3,O3) \Rightarrow (SO1,SO2,SO4) \qquad (13)$$

$$(C3,O4) \Rightarrow (SO3,SO1) \qquad (14)$$

$$(C3,O5) \Rightarrow (SO1,SO2) \qquad (15)$$

In one example, based on Equation 1 above, the first output, 'O1', of the first instance of the plurality of core instances, 'C1', may be associated with primary output pins 'SO1' and 'SO2'. While this exemplary compression equation has been described, any equation may be used within the scope of the present disclosure.

In some embodiments, failure location diagnostic process 10 may include applying (206) one or more test patterns to the plurality of core instances. "Test patterns" as used herein may include, but are not limited to, defined inputs that are configured to produce an expected result when received at the primary output pins. In some embodiments, test patterns may include binary values (e.g., logical 0's and 1's). In some embodiments, test patterns may be configured to test for specific failures. Examples of specific defects may include, but are not limited to, stuck defects, transition defects, bridge defects, and open defects. In some embodiments, applying a test pattern may include applying a scan chain. A "scan chain" as used herein may include, but is not limited to, one or more sequential data elements that are connected so that, in a "scan mode", one data port may be used to form all storage elements into a set of shift registers between a set of primary inputs and a set of primary outputs.

Figure 5:
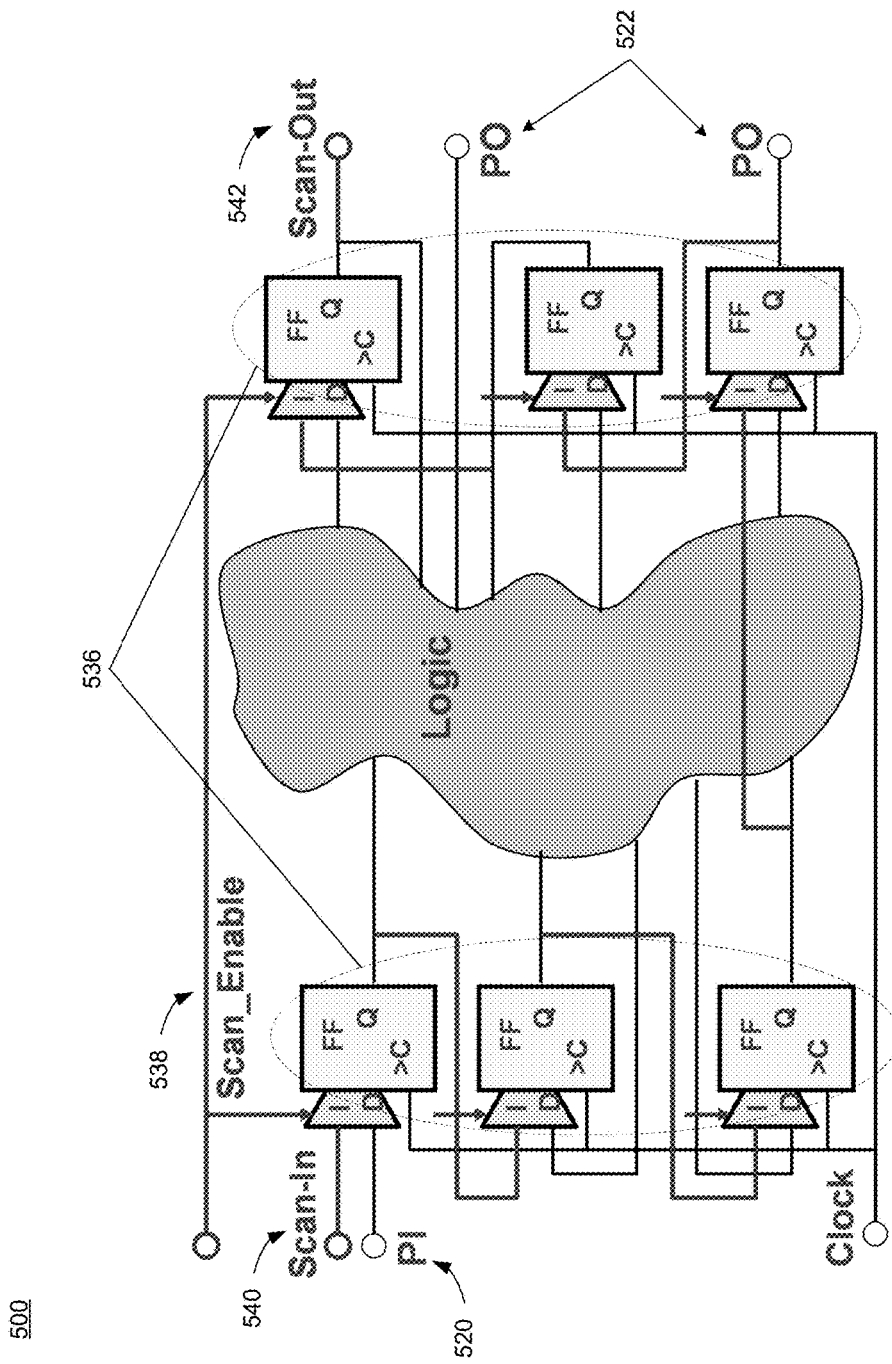
FIG. 5 is a diagram depicting an embodiment incorporating failure location diagnostic process in accordance with the present disclosure.

As shown in FIG. 5, a scan chain may be created by modifying one or more storage elements 536 in a circuit (flip-flops, latches, etc.) so that they have at least two data ports. By setting the circuit to "scan mode" (e.g., by triggering Scan_Enable 538), the scan-in pins 540 may be set to any arbitrary logic state with a single scan load. In addition, the previous internal state of the circuit may be observed at the scan-out pins 542 with a single scan unload. Each storage element 536 (flip-flop, latch) may act like a primary input and primary output. After each scan, each storage element may hold an arbitrary value. In some embodiments, by applying a clock signal, the test results at each storage element may be scanned out and observed. For more information on scan chains, see Stanley, K., "High-accuracy flush-and-scan software diagnostic," in Design & Test of Computers, IEEE, vol. 18, no. 6, pp. 56-62, November/December 2001.

Referring again to FIG. 4, the one or more test patterns may be applied to the primary input pins 434 of the tester 430. The one or more test patterns may be modified and/or compressed based upon, at least in part, the plurality of core instances 424 and/or the compressor network 432. The resulting compressed test patterns may be received at the primary output pins 428. An ideal chip may produce an expected compressed test pattern at the primary output pins 428 for each test pattern applied to the primary input pins 434.

In some embodiments, failure location diagnostic process 10 may include identifying (208) one or more failures based upon, at least in part, one or more compressed test patterns received at the one or more primary output pins 428. A "failure" as used herein may include, but is not limited to, a real response that is measured at the primary output pins 426 (e.g., an actual compressed test pattern) that differs from a predicted response (e.g., an expected compressed test pattern) for a given test pattern. Any differences between the actual compressed test pattern and the expected compressed test pattern may be a failure. In some embodiments, the one or more failures may be identified from a test pattern applied to a tester 430.

In some embodiments, failure location diagnostic process may include performing (210) fault selection on one of the plurality of core instances for each of the one or more failures associated with the plurality of core instances. In some embodiments, an identified failure may result from one or more candidate faults. A candidate fault as used herein may include, but is not limited to, a possible cause of one or more failures. In some embodiments, a single core, 'C', may be instantiated for performing fault selection and, as will be discussed in greater detail below, for fault simulations. In some embodiments, the single core instance may be an OOC core. In some embodiments, fault selection and/or fault simulations may be performed on the single OOC core without loading multiple copies of each core instance. In some embodiments, the performance of fault location diagnosis process 10 may be enhanced by loading only a single copy of OOC core. This single copy of the OOC core may be referred hereafter as the diagnostic OOC core.

In some embodiments, performing fault selection on one of the plurality of core instances may include identifying the primary output pin 428 associated with each of the one or more failures. In some embodiments, a failure may be identified at one or more of the primary output pins 428 of the tester 430. In some embodiments, performing fault selection may also include tracing back from the primary output pin associated with each of the one or more failures to one or more output pins 428 associated with each of the plurality of core instances 424 based upon, at least in part, the compressor equations. As discussed above, the compressor equations may define a relationship between each of the one or more primary output pins 428 and the one or more outputs 426 of each of the plurality of core instances 428. Referring again to FIG. 4 and in one example, a failure may be measured on the primary output pin 'SO1' of the primary output pins 428. However, a failure may be not measured on every primary output pin 428 and/or may be measured on only one or more primary output pins. According to the example compressor equations described above (Equations 1-15), 'SO1' may be traced back to the following output pins 426 of each of the plurality of core instances 424 as shown in Table 1:

TABLE 1

| Primary Output Pin | Instance Output Pins | | |
|---|---|---|---|
| | C1 | C2 | C3 |
| SO1 | O1, O2, O3, O5 | O1, O2, O3, O4, O5 | O3, O5 |

Performing fault selection may include tracing back from each of the one or more output pins associated with one of the plurality of core instances to obtain the one or more candidate faults associated with each of the one or more output pins. Based on the example described above and as shown in Table 1, one or more output pins of the plurality of core instances may be associated with a failure on one or more primary output pins. Returning to the above example, the output pin 'O1' from instances 'C1' and 'C2' may be associated with a failure on 'SO1'. In other words, a failure at 'SO1' may be caused by a fault from between the primary input pins 434 and the core output pin 'O1' of instance 'C1' and/or instance 'C2'. In some embodiments, the diagnostic OOC core may be used to back trace one or more candidate faults from each of the output pins 426 associated with a failure on a primary output pin 428. Back tracing, as used herein may include but is not limited to, identifying a path and/or logic from which a failure could originate. In other words, back tracing may reduce a number of candidate faults by identifying one or more faults that may cause the failure from those unrelated to the failure. Returning to the above example, one or more candidate faults may be identified for the one or more output pins 322 of the diagnostic OOC core. Example candidate faults may be summarized below in Table 2:

TABLE 2

| Instance | Candidate Faults | | | | |
|---|---|---|---|---|---|
| Output Pin | 1 | 2 | 3 | 4 | 5 |
| O1 | X | X | | X | |
| O2 | | X | | | X |
| O3 | | | X | | |
| O4 | | | | X | |
| O5 | | | | | X |

In some embodiments, performing fault selection may include maintaining a record of the plurality of core instances 424 associated with each of the one or more candidate faults. In some embodiments, fault location diagnostic process 10 may keep track of the core instances associated with each fault. In some embodiments, the plurality of core instances 424 may be associated with the one or more candidate faults based upon, at least in part, the association of the primary output pins 428 and the plurality of core instances 424 and/or the candidate faults associated with the one or more outputs 322 of the diagnostic OOC core. Returning to the above example, the candidate faults shown in Table 2 may be associated with the plurality of core instances 424 based upon the compressor equations as shown in Table 1, as shown below in Table 3:

TABLE 3

| Instance | Candidate Faults | | | | |
|---|---|---|---|---|---|
| Output Pins | 1 | 2 | 3 | 4 | 5 |
| C1 | X | X | X | | X |
| C2 | X | X | X | X | X |
| C3 | | | X | | X |

In some embodiments, associations between the candidate faults and the plurality of core instances may be summarized by an equation where 'F' may represent the candidate faults associated with a failure, 'f1' may represent a first candidate fault, and 'C1' may represent the first instance. Proceeding faults and instances may be represented by 'f#' and 'C#', respectively, where '#' represents a numerical index. Equation 16, below, represents the candidate faults associated with the failure measure on 'SO1' from the above example.

$$F=\{(f1,C1,C2),(f2,C1,C2),(f3,C1,C2,C3),(f4,C2),(f5,C1,C2,C3)\} \quad (16)$$

In some embodiments, failure location diagnostic process 10 may include performing (212) fault simulations on the single core instance for each of one or more candidate faults associated with the plurality of core instances. In some embodiments, the single core instance may be a diagnostic OOC core. "Fault simulation" as used herein may include, but is not limited to simulating a test pattern against an ideal core instance, and a core instance that contains at least one candidate fault. Fault simulation may be used to determine if a core instance with at least one candidate fault obtains the same result as an ideal core instance. If a difference is detected, then the candidate fault is a detected fault. If a difference is not detected, then the candidate fault may not have contributed to a failure and may be removed from the list of candidate failures. In other words, if the result of the fault simulation is different that an expected response, the candidate fault may be detected (e.g., a detected fault). As described above, fault simulations may be performed on a diagnostic OOC core. In some embodiments, because fault simulations may be performed on a diagnostic OOC core, each candidate fault may only be simulated once instead of being simulated for each of the plurality of core instances. In some embodiments, failure location diagnostic process 10 may include performing fault simulations on multiple faults concurrently.

In some embodiments, performing fault simulations on the single core instance may also include applying one or more test patterns to the single core instance. In some embodiments, the one or more test patterns may be configured to test for specific faults. Examples of specific faults may include, but are not limited to, stuck faults, slow faults, and fast faults. In some embodiments, performing fault simulations may include identifying the one or more detected faults based upon, at least in part, one or more compressed test patterns received at the one or more outputs of the single core instance. As described above, the detected faults may be identified when there are differences between the result a test pattern applied to an ideal instance and the result of the test pattern simulated on the diagnostic OOC core with the candidate fault In some embodiments, failure location diagnostic process 10 may include generating (214) one or more fault signatures for each of one or more detected faults based upon, at least in part, the plurality of core instances associated with each of the one or more detected faults. As will be discussed in greater detail below, maintaining one or more fault signatures specific to each of the plurality of core instances may allow the application of multiple-defect analysis to maximize diagnosis accuracy.

In some embodiments, generating the one or more fault signatures may include generating a list of one or more internal detect locations for each of the one or more detected faults. A "fault signature" as used herein may include, but is not limited to a list of detected faults and outputs at which errors are detected. An "internal detect location" as used herein may include, but is not limited to, the location of a defect within an instance. In some embodiments, internal detect locations may include flip-flops in a scan-chain and/or the primary output pins of an OOC core. As described above and referring again to FIG. 5, when a candidate fault is simulated, the fault effects may be propagated to the scan flip-flops 536 and/or core output pins 522. In a hierarchical test scenario, the internal detect locations may not be directly observed given the presence of multiple core instances 424 and the compressor network 432 in between the plurality of core instances 424 and the primary output pins 428 of the chip. In other words, if a fault is simulated in a diagnostic OOC core, the internal detect locations may be the same for all the core-instances in which this fault is selected. In some embodiments, the flops in a scan chain 536 and core output pins 522 may be the internal detect locations for a detected fault. Additionally, the output detect locations (e.g., output on the primary output pins 428) may vary given the compressor equations, as each compressor equation may be designed differently for each of the plurality of core instances 424. As will be described in greater detail below, the compressor equations may be applied to the internal detect locations to generate one or more fault signatures for each detected fault and each of the plurality of core instances associated with that detected fault.

In some embodiments, generating the one or more fault signatures may include applying the compressor equations to the internal detect locations to generate the one or more fault signatures for each detected fault and each of the plurality of core instances associated with that detected fault. In some embodiments, a fault signature may be generated at the chip level for each core instance. In some embodiments, associations between the candidate fault and the core instance may be summarized by an equation where 'S' may represent an output fault signature, 'f1' may represent a first candidate fault, and 'C1' may represent the first instance. Proceeding faults and instances may be represented by 'f#' and 'C#', respectively, where '#' represents the numerical index for each fault and/or instance. Equation 17, below, represents the collection of fault signatures for candidate faults associated with the failure measure on 'SO1' from the above example.

$$S'=\{S(f1,C1),S(f1,C2),S(f2,C1),S(f2,C2),S(f3,C1),S(f3,C2),S(f3,C3),S(f4,C2),S(f5,C1),S(f5,C2),S(f5,C3)\} \quad (17)$$

Figure 6:
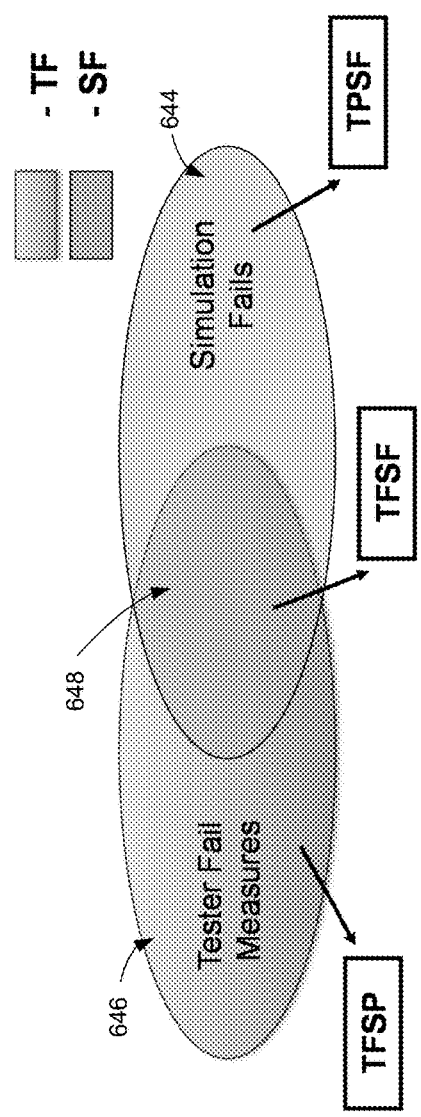
FIG. 6 is a diagram depicting an embodiment incorporating failure location diagnostic process in accordance with the present disclosure.

In some embodiments and as shown in FIG. 6, failure location diagnostic process 10 may include analyzing (216) each of the one or more fault signatures to determine one or more failure locations for each of the one or more failures. In some embodiments, analyzing each of the one or more fault signatures may include comparing the one or more failures to the one or more fault signatures. In one embodiment, ideal results from the one or more test patterns may be compared with actual results from the tester 430 and/or a fault signature. If the tester's result is different from the ideal results for a given test pattern, the tester fails (e.g., 'TF'). If the tester's result is identical to the ideal result for a given test pattern, the tester passes (e.g., 'TP'). If the fault signature is different from the ideal results for a given test pattern, the simulation fails (e.g., 'SF'). If the fault signature is identical to the ideal results for a given test pattern, the simulation passes (e.g., 'SP'). If a test pattern comparison results in a tester pass and a simulation fail, it is a 'TPSF' 644. A 'TPSF' 644 may be a misprediction or a prediction not fulfilled by behavior observed from a tester. If a test pattern comparison results in a tester fail and a simulation pass, it is a 'TFSP' 646. A 'TFSP' 646 may be a non-prediction or a behavior not predicted by fault simulations. If a test pattern comparison results in a tester pass and a simulation pass, it is a 'TPSP'. If a test pattern comparison results in a tester fail and a simulation fail, it is a 'TFSF' 648.

In some embodiments, analyzing each of the one or more fault signatures may include performing multiple-defect analysis on each of the plurality of core instances based upon, at least in part, the one or more fault signatures. Multiple-defect analysis as used herein may include, but is not limited to, determining the smallest combination of faults that explain the maximum number of tester failures. In one example, a single fault (or a single defective location) may cause a failure. A comparison of the one or more detected faults and the compressed test patterns that generated the failure may reveal that a failure is caused by a single fault. However, in another example, more than one location may be defective in a failing chip. Fault simulation may be performed assuming at least one location is defective. If there are multiple defective locations, no one fault signature may explain most and/or all of the failures observed at the tester. In these cases, multiple-defect analysis may select combinations of faults and their signatures and determine the combination of faults that explain most of the tester failures. Multiple-defect analysis may use some and/or all of the one or more fault signatures determined in the simulation (e.g., the fault signatures shown in Equation 17) to determine the smallest combination of faults that explain the maximum number of tester failures based on the one or more fault signatures.

In some embodiments, analyzing each of the one or more fault signatures may include scoring the one or more fault signatures based upon, at least in part, the multiple defect analysis of each of the plurality of core instances. In some embodiments, the comparison of a test pattern may result in one or more of a TPSP, TPSF, TFSP, and TFSF. In some embodiments a score may be generated based upon, at least in part, points awarded and/or deducted for each comparison (e.g., TFSF, TFSP, TPSF). In one example, points may be awarded for matching observed failures (e.g., TFSF). In another example, points may be deducted for not predicting failures (e.g., TFSP and/or TPSF). In some embodiments, a score may be generated for each fault signature based upon Equation 18 shown below:

$$\text{Score}=(TFSF/(TFSF+TFSP+TPSF))*100 \quad (18)$$

Figure 7:
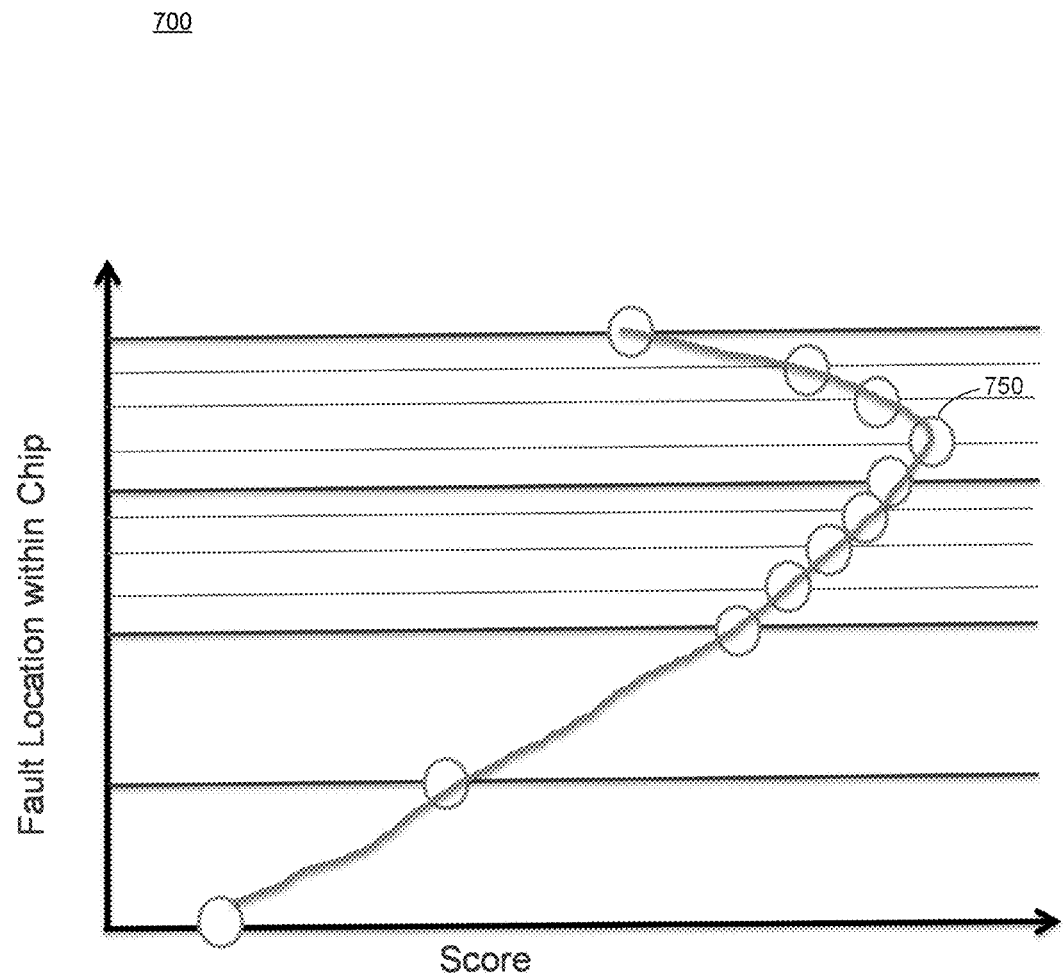
FIG. 7 is a graph depicting results from an embodiment incorporating failure location diagnostic process in accordance with the present disclosure.

In some embodiments and as shown in FIG. 7, failure location diagnostic process 10 may include reporting the results of the scoring. In one embodiment, final diagnosis results may identify one or more failure locations at the full chip level based upon, at least in part, the scoring of the one or more fault signatures. In one example, as shown in FIG. 7, scores associated with one or more fault signatures may be displayed on a graph 700. The x-axis in the graph may represent the score and the y-axis may represent the fault signature and/or a location associated with the fault signature (e.g., the location of the fault within the chip). The one or more failure locations may be identified based on the one or more fault signatures and/or the fault location associated with one or more fault signatures with the highest score (e.g., component 750). In some embodiments, the results of failure location diagnostic process 10 may be reported to a user. In one example, the results may be reported via a graphical user interface.

Figure 8:
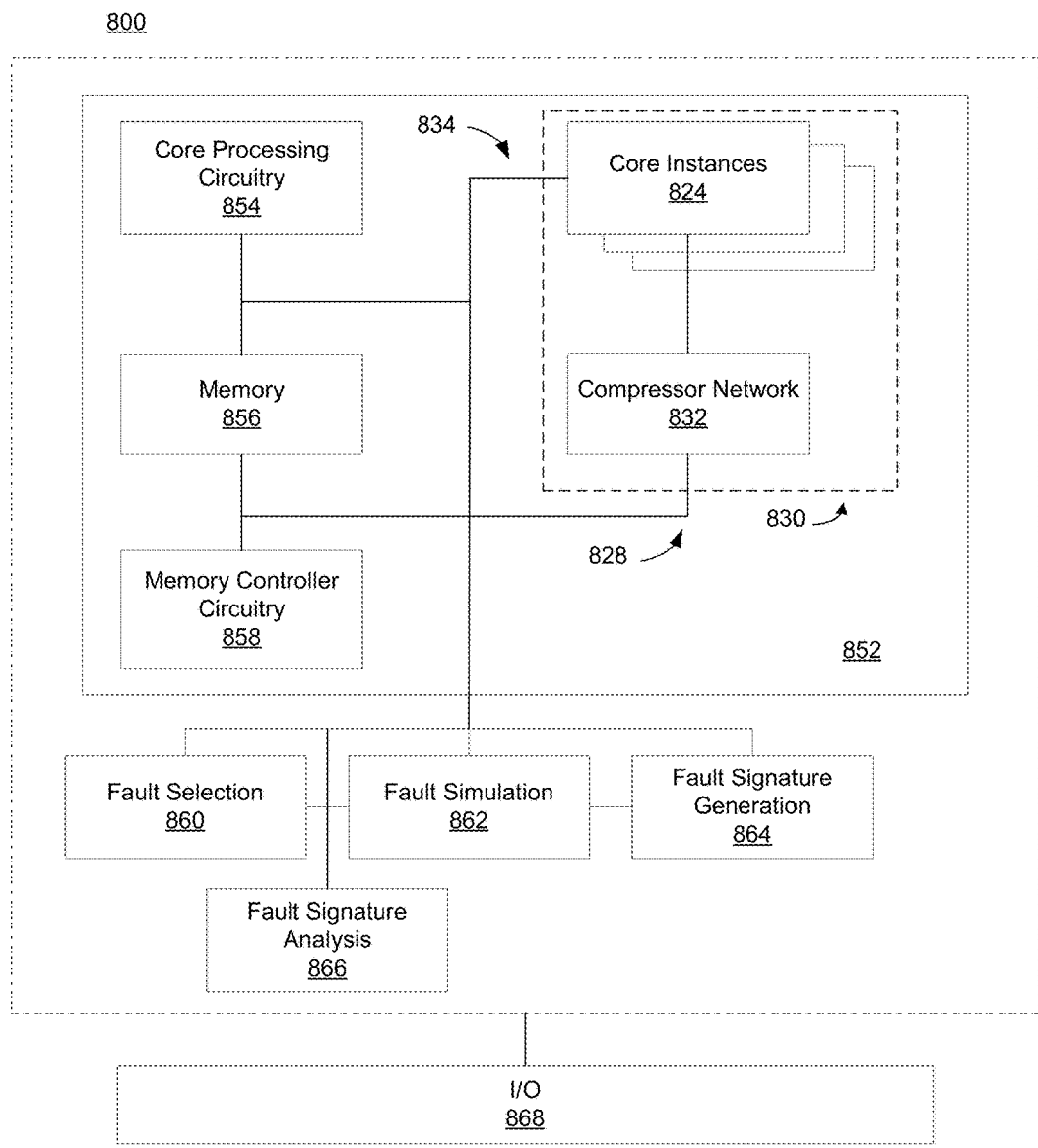
FIG. 8 is a block-diagram depicting an embodiment incorporating failure location diagnostic process in accordance with the present disclosure.

In some embodiments and as shown in FIG. 8, an automatic test equipment (ATE) 852 device may include core processing circuitry 854 in communication with a plurality of core instances 824 and a memory 856. The memory may be controlled by memory controller circuitry 858. The plurality of core instances 824 may be configured to receive input from and transmit output to the core processing circuitry 854. In some embodiments, one or more primary input pins 834 may receive input from the core processing circuitry 854 and transmit the input to the input pins of each of the plurality of core instances 824. In some embodiments, a compressor network 832 may be configured to receive the output from the output pins of the plurality of core instances 824. In some embodiments, the plurality of core instances 824 and the compressor network 832 may form a tester 830. In some embodiments, one or more primary output pins 828 of the tester 830 may be configured to receive output from the tester 830 and transmit the output to the core processing circuitry 854.

One or more test patterns, created using a method such as Automatic Test Pattern Generation, may be stored in memory 856; the core processing circuitry 854 may access the memory 856 to retrieve the one or more test patterns and transmit the one or more test patterns to the primary input pins 834. Upon receiving the actual compressed test pattern, the core processing circuitry 854 may compare the actual compressed test pattern to an expected compressed test pattern. If the actual compressed test pattern and the expected compressed test pattern fail to match, the core processing circuitry 854 may record the actual compressed test pattern, or portions thereof, as a failure in memory 856, in association with the primary output pins and/or the input test pattern as a failure. Each identified failure may be added to a chip failure report.

A fault selection module 860 may be configured to communicate with the ATE device 852, and more specifically the core processing circuitry 854. The fault selection module 860 may receive a single core instance (e.g., a diagnostic OOC core) from the core processing circuitry 854. The fault selection module 860 may also receive information regarding one or more identified failures. In some embodiments, one or more candidate faults may be determined by the fault selection module 860 based upon, at least in part, the one or more identified failures, as discussed above.

A fault simulation module 862 may be configured to communicate with the ATE and/or the fault selection module 860, and may receive the single core instance (e.g., the diagnostic OOC core) therefrom. In some embodiments, the one or more identified failures may be received from the ATE and/or the fault selection modules. The fault simulation module 862 may simulate each candidate fault in the diagnostic OOC core and may determine the failures that would result from each candidate fault. Fault simulation module 862 may determine one or more detected faults based upon, at least in part, the failures that would result from each candidate fault, as simulated.

A fault signature generation module 864 may be in communication with the fault simulation module 862, and may receive the one or more detected faults and/or the results of each of the one or more detected faults. The fault signature generation module 864 may also be in direct communication with the core processing circuitry 854, and may receive one or more detected faults therefrom. In some embodiments, the fault signature generation module 864 may generate one or more fault signatures for each detected fault based upon, at least in part, the detected faults and/or the one or more instances of the plurality of core instances associated with each detected fault.

A fault signature analysis module 866 may be in communication with the fault signature generation module 864, and may receive the one or more fault signatures. The fault signature analysis module 866 may also be in direct communication with the core processing circuitry 854, and may receive one or more fault signatures therefrom. In some embodiments, the fault signature analysis module 866 may additionally and/or alternatively be in direct communication with the fault selection module 860, and chip failure reports may be received therefrom, instead of from the core processing circuitry 854. The fault signature analysis module 866 may compare each fault signature to each of the one or more failures from the chip failure report. The fault signature analysis module 866 may generate a score for each fault signature. The fault signature analysis module 866 may report one or more failure locations based upon, at least in part, the scores of the one or more fault signatures.

An input/output (I/O) component 868 may collectively communicate with other components in the system, including but not limited to the core processing circuitry 854 and/or one or more of the modules 860, 862, 864, and 866. In particular, the I/O 630 may instruct the core processing circuitry 854 to provide input to and capture output from plurality of core instances, may instruct the core processing circuitry 854 to send the single core instance (e.g., the diagnostic OOC core), failures information, and/or other data to one of the modules 860, 862, 864, or 866, and may receive the one or more failure locations from the fault signature analysis module 866.

Figure 9:
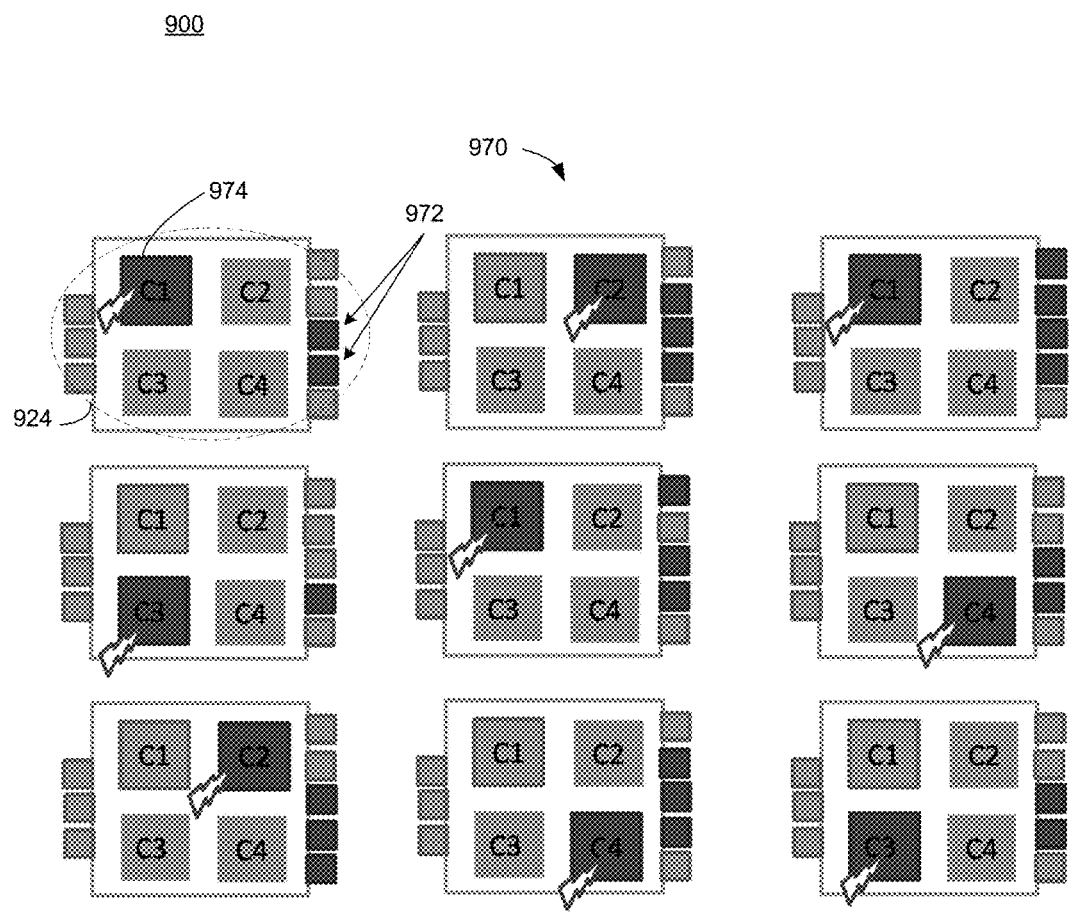
FIG. 9 is a diagram depicting an embodiment incorporating failure location diagnostic process in accordance with the present disclosure.

In some embodiments and as shown in FIG. 9, failure location diagnostic process 10 may be implemented for multiple failing ICs 970 using the hierarchical test methodology, as discussed above. As shown in FIG. 9, a plurality of chips 970 may include a plurality of core instances 924. In some embodiments, one or more of the plurality of core instances 924 may be active. Here, four core instances 'C1', C2', C3', and 'C4' of the same core 'C' are shown in each of the plurality of chips 970. While four instances have been used in this example, any number of core instances is within the scope of the present disclosure. In some embodiments, one or more failures 972 may be identified from the plurality of chips (e.g., identified at the primary output pins of each of the plurality of chips 970). The one or more failures 972 may be identified by the process described above. In some embodiments, one or more failing core instances 974 may be identified based upon, at least in part, the one or more failures 972 identified by the process described above.

Figure 10:
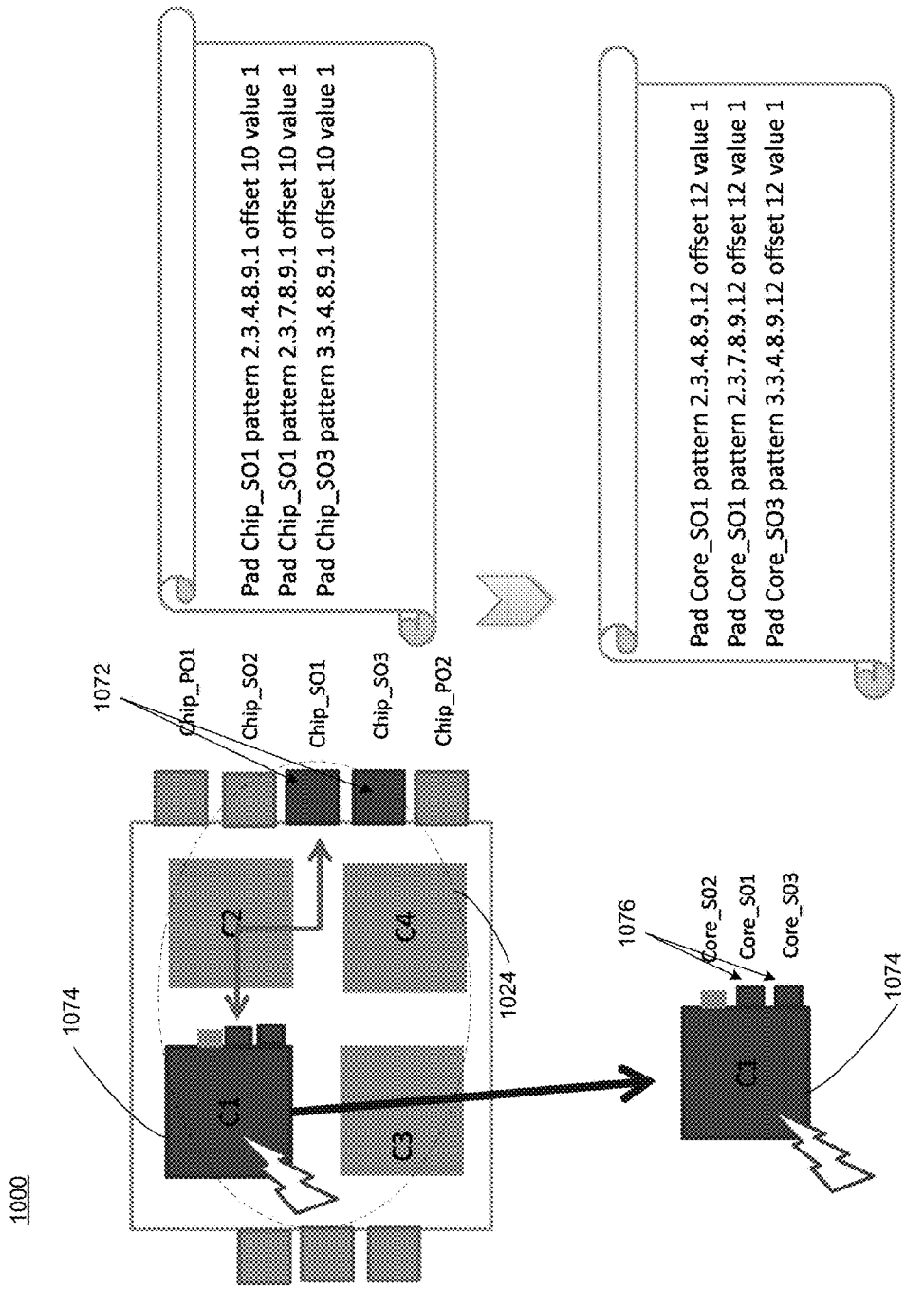
FIG. 10 is a diagram depicting an embodiment incorporating failure location diagnostic process in accordance with the present disclosure.

In some embodiments and as shown in FIG. 10, failure location diagnostic process 10 may include selecting all or at least a portion of the plurality of chips 970. In one example, one thousand (e.g., 1,000) chips of the plurality of chips 970 may be selected. From the selected plurality of chips 970, one or more failures may be migrated from the chip level 1072 to the core level 1076. In some embodiments, the one or more failures 1072 may be migrated from the chip level 1072 to the diagnostic OOC core level 1076. In some embodiments, migrating the one or more failures 1072 may be based upon, at least in part, mapping information obtained during the stitching of one or more core instances. "Stitching", as used herein, may include but is not limited to connecting the plurality of core instances to the compressor network.

Figure 11:
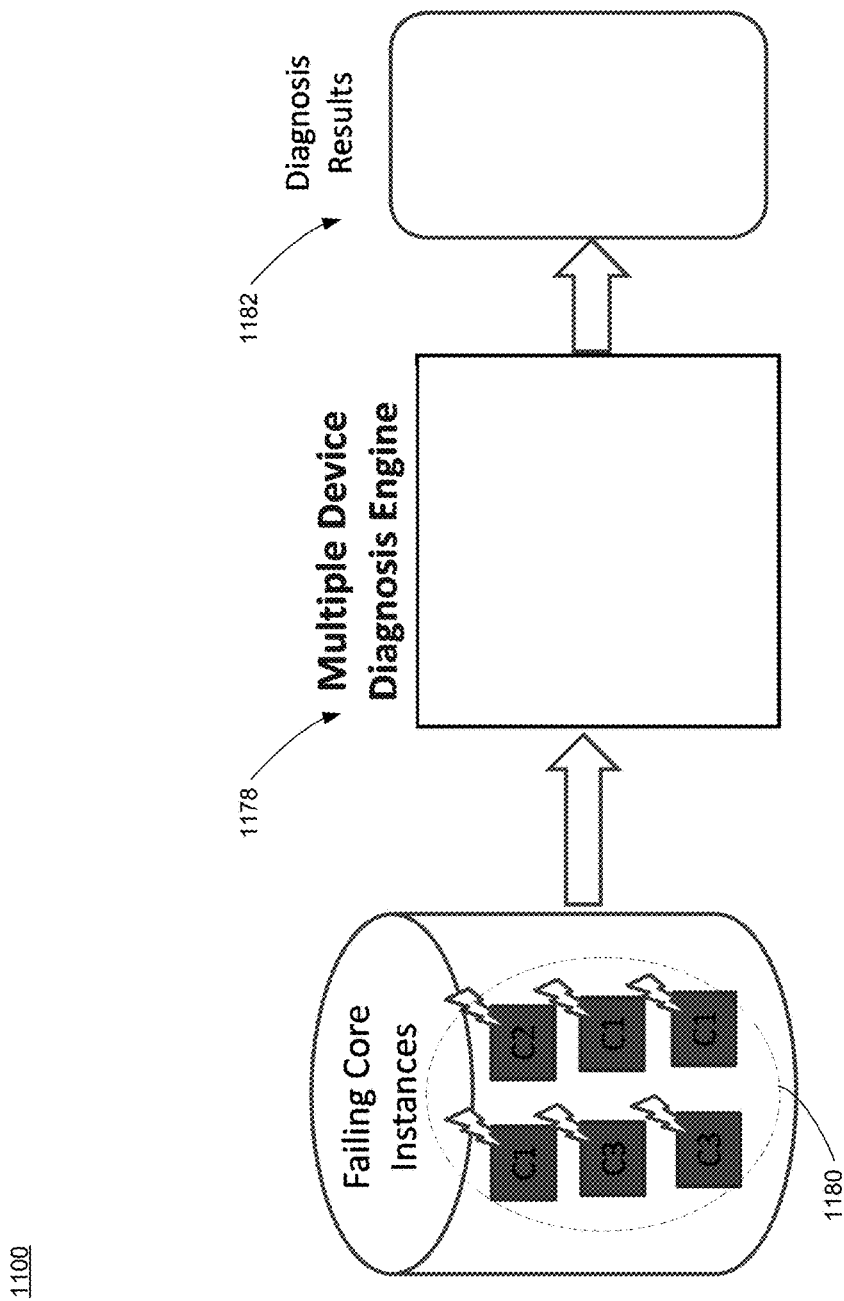
FIG. 11 is a diagram depicting an embodiment incorporating failure location diagnostic process in accordance with the present disclosure.

In some embodiments and as shown in FIG. 11, failure location diagnostic process 10 may include loading a diagnostic OOC core and considering each failing core instance as a different failing device and/or chip. In some embodiments, the name of the failing core instance associated with each of the one or more failures may be retained. Failure location diagnostic process 10 may include performing multiple device diagnosis 1178 on one or more migrated failing core instances 1180. Multiple device diagnosis may include, but is not limited to, diagnosing multiple failing chips in a single process. In other words, fault location diagnostic process 10, described above and relating to diagnosing failure locations in a chip, may include diagnosing failure locations in multiple chips and/or multiple electronic circuits. In some embodiments, failure location diagnostic process 10 may include collecting the results 1182 of the multiple device diagnosis 1178.

Figure 12:
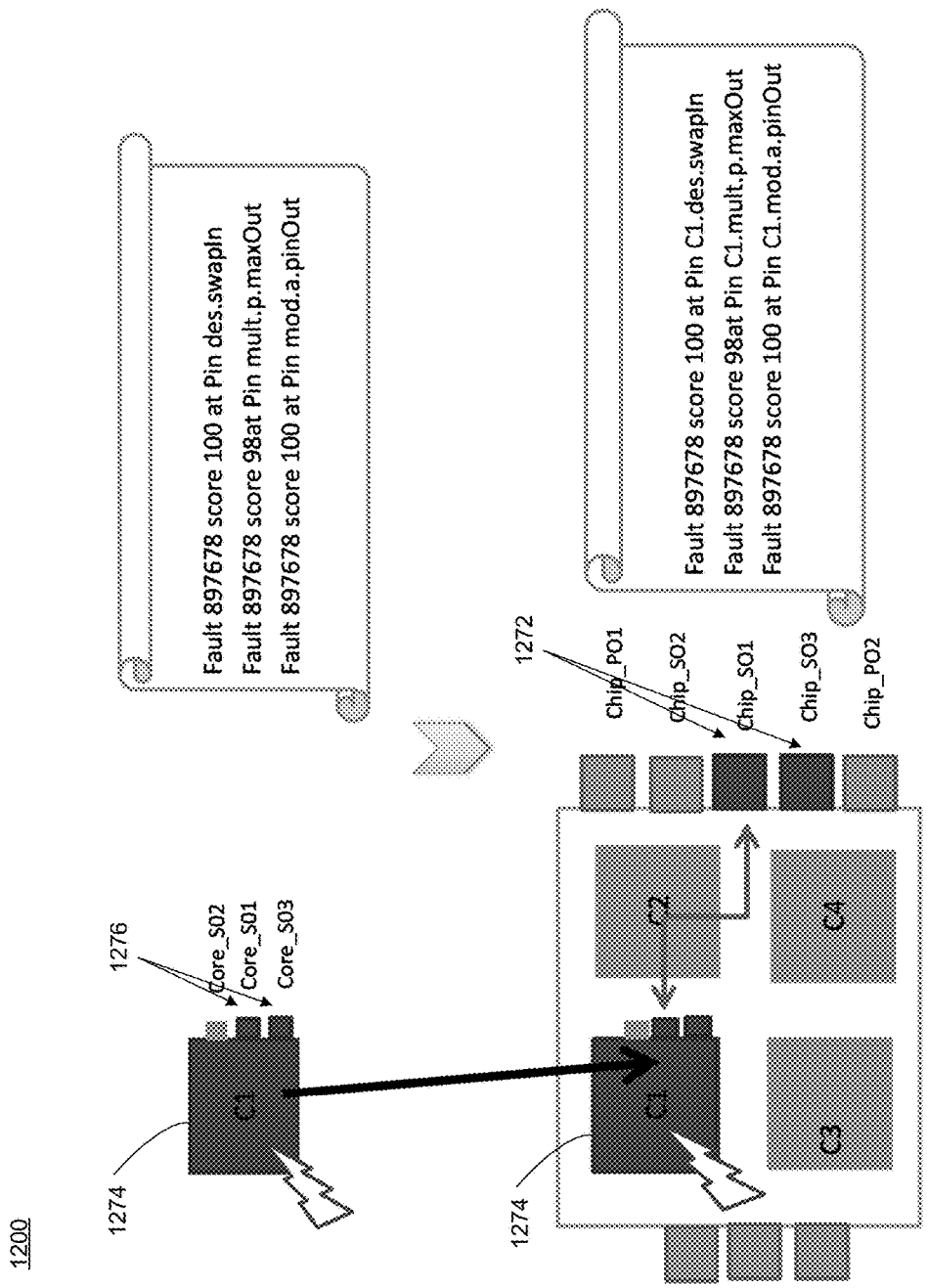
FIG. 12 is a diagram depicting an embodiment incorporating failure location diagnostic process in accordance with the present disclosure.

In some embodiments and as shown in FIG. 12, the results 1182 of the multiple device diagnosis 1180 may be available at the core level 1276 for each of the one or more failing core instances 1274. In some embodiments, the name of each failing core instance associated with each of the one or more failures may be used to determine one or more exact topological failure locations from a full chip perspective. Failure location diagnostic process 10 may include mapping the one or more failing locations back to the chip level 1272 and reporting the one or more failure locations to a user, as discussed above. This may be repeated for each failing core instance of the plurality of chips.

In some embodiments, failure location diagnostic process 10 may reduce computer run time and computer resource (memory) requirements. In some embodiments of the present disclosure failure locations may be diagnosed for a few thousand failing chips with a run time increase of up to 130× and a memory gain of up to 96×.

Failure location diagnostic process 10 may be configured to operate with various ATE applications such as those available from the Assignee of the present disclosure, which may allow the user to diagnose failure locations within an integrated circuit design.

As used in any embodiment described herein, the terms "circuit" and "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof. Embodiments of the present disclosure may be incorporated in whole or in part into any design tools.

As will be appreciated by one skilled in the art, the present disclosure may be embodied as a method, system, or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

Any suitable computer usable or computer readable medium may be utilized. The computer readable medium may be a computer readable signal medium or a computer readable storage medium. A computer-usable, or computer-readable, storage medium (including a storage device associated with a computing device or client electronic device) may be, for example, but not limited to, an electronic, magnetic, optical, electromagnetic, infrared, or semiconductor system, apparatus, or device, or any suitable combination of the foregoing. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device. In the context of this document, a computer-usable, or computer-readable, storage medium may be any tangible medium that can contain, or store a program for use by or in connection with the instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

Computer program code for carrying out operations of the present disclosure may be written in an object oriented programming language such as Java, Smalltalk, C++ or the like. However, the computer program code for carrying out operations of the present disclosure may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present disclosure is described below with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A method for diagnosing failure locations in one or more electronic circuits comprising:
   generating, using at least one processor, a plurality of core instances of at least one core, for each electronic circuit of the one or more electronic circuits, with one or more outputs;
   compressing the one or more outputs of each of the plurality of core instances into one or more primary output pins based upon, at least in part, one or more compression equations;
   applying one or more test patterns to the plurality of core instances using an automatic test equipment device;
   identifying one or more failures based upon, at least in part, one or more compressed test patterns received at the one or more primary output pins;
   performing fault selection on a single core instance for each of the one or more failures associated with the plurality of core instances;
   performing fault simulations on the single core instance for each of one or more candidate faults associated with the plurality of core instances;
   generating one or more fault signatures for each of one or more detected faults based upon, at least in part, the plurality of core instances associated with each of the one or more detected faults; and
   analyzing each of the one or more fault signatures to determine one or more failure locations for each of the one or more failures.

2. The method of claim 1, wherein the plurality of core instances are instances of a single out-of-context core.

3. The method of claim 1, wherein the single core instance is an out-of-context core.

4. The method of claim 1 further comprising:
   determining the one or more compressor equations for each of the plurality of core instances.

5. The method of claim 1, wherein performing fault selection on the single core instance further comprises:
   identifying the primary output pin associated with each of the one or more failures;
   tracing back from the primary output pin associated with each of the one or more failures to one or more output pins associated with each of the plurality of core instances;
   tracing back from each of the one or more output pins associated with the single core instance to obtain the one or more candidate faults associated with each of the one or more output pins; and
   maintaining a record of the plurality of core instances associated with each of the one or more candidate faults.

6. The method of claim 1, wherein performing fault simulations on the single core instance further comprises:
   applying one or more test patterns to the single core instance; and
   identifying the one or more detected faults based upon, at least in part, one or more compressed test patterns received at the one or more outputs of the single core instance.

7. The method of claim 1, wherein generating the one or more fault signatures further comprises:
   generating a list of one or more internal detect locations for each of the one or more detected faults; and
   applying the compressor equations to the internal detect locations to generate the one or more fault signatures for each detected fault and each of the plurality of core instances associated with that detected fault.

8. The method of claim 1, wherein analyzing each of the one or more fault signatures further comprises:
   comparing the one or more failures to the one or more detected faults;
   performing multiple defect analysis on each of the plurality of core instances based upon, at least in part, the one or more fault signatures;
   scoring the one or more fault signatures based upon, at least in part, the multiple defect analysis of each of the plurality of core instances; and
   reporting the results of the scoring.

9. A system for diagnosing failure locations in one or more electronic circuits comprising:
   a computing device having at least one processor configured to generate, using at least one processor, a plurality of core instances of at least one core, for each electronic circuit of the one or more electronic circuits, with one or more outputs, compress the one or more outputs of each of the plurality of core instances into one or more primary output pins based upon, at least in part, one or more compression equations, apply one or more test patterns to the plurality of core instances using an automatic test equipment device, identify one or more failures based upon, at least in part, one or more compressed test patterns received at the one or more primary output pins, perform fault selection on a single instance for each of the one or more failures associated with the plurality of core instances, perform fault simulations on of the single core instance for each of one or more candidate faults associated with the plurality of core instances, generate one or more fault signatures for each of one or more detected faults based upon, at least in part, the plurality of core instances associated with each of the one or more detected faults, and analyze each of the one or more fault signatures to determine one or more failure locations for each of the one or more failures.

10. The system of claim 9, wherein the plurality of core instances are instances of a single out-of-context core.

11. The system of claim 9, wherein the single core instance is an out-of-context core.

12. The system of claim 9 wherein the at least one processor is further configured to:
   determine the one or more compressor equations for each of the plurality of core instances.

13. The system of claim 9, wherein performing fault selection on the single core instance further comprises:
   identifying the primary output pin associated with each of the one or more failures;
   tracing back from the primary output pin associated with each of the one or more failures to one or more output pins associated with each of the plurality of core instances;
   tracing back from each of the one or more output pins associated with the single core instance to obtain the one or more candidate faults associated with each of the one or more output pins; and
   maintaining a record of the plurality of core instances associated with each of the one or more candidate faults.

14. The system of claim 9, wherein performing fault simulations on the single core instance further comprises:
   applying one or more test patterns to the single core instance; and
   identifying the one or more detected faults based upon, at least in part, one or more compressed test patterns received at the one or more outputs of the single core instance.

15. The system of claim 9, wherein generating the one or more fault signatures further comprises:
   generating a list of one or more internal detect locations for each of the one or more detected faults; and
   applying the compressor equations to the internal detect locations to generate the one or more fault signatures for each detected fault and each of the plurality of core instances associated with that detected fault.

16. The system of claim 9, wherein analyzing each of the one or more fault signatures further comprises:
   comparing the one or more failures to the one or more detected faults;
   performing multiple defect analysis on each of the plurality of core instances based upon, at least in part, the one or more fault signatures;
   scoring the one or more fault signatures based upon, at least in part, the multiple defect analysis of each of the plurality of core instances; and
   reporting the results of the scoring.

17. A method for diagnosing failure locations in one or more electronic circuits comprising:
   generating, using an automated test equipment (ATE) device, a plurality of core instances of at least one core, for each electronic circuit of the one or more electronic circuits, with one or more outputs;
   compressing, using a compressor network, the one or more outputs of each of the plurality of core instances into one or more primary output pins based upon, at least in part, one or more compression equations;
   applying one or more test patterns to the plurality of core instances using an automatic test equipment device;
   identifying one or more failures based upon, at least in part, one or more compressed test patterns received at the one or more primary output pins;
   performing fault selection, using a fault selection module, on a single core instance for each of the one or more failures associated with the plurality of core instances;
   performing fault simulations, using a fault simulation module, on the single core instance for each of one or more candidate faults associated with the plurality of core instances;
   generating one or more fault signatures, using a fault signature module, for each of one or more detected faults based upon, at least in part, the plurality of core instances associated with each of the one or more detected faults; and
   analyzing each of the one or more fault signatures, using a fault signature analysis module, to determine one or more failure locations for each of the one or more failures.

18. The method of claim 17, wherein the plurality of core instances are instances of a single out-of-context core.

19. The method of claim 17, wherein the single core instance is an out-of-context core.

20. The method of claim 17, wherein performing fault selection, using the fault selection module, on the single core instance further comprises:
   identifying the primary output pin associated with each of the one or more failures;
   tracing back from the primary output pin associated with each of the one or more failures to one or more output pins associated with each of the plurality of core instances;
   tracing back from each of the one or more output pins associated with one of the plurality of core instances to obtain the one or more candidate faults associated with each of the one or more output pins; and
   maintaining a record of the plurality of core instances associated with each of the one or more candidate faults.

* * * * *